(12) United States Patent  
Kanzaki (10) Patent No.: US 7,432,740 B2  
(45) Date of Patent: Oct. 7, 2008

(54) LEVEL CONVERSION CIRCUIT FOR CONVERTING VOLTAGE AMPLITUDE OF SIGNAL

(75) Inventor: Teruaki Kanzaki, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 152 days.

(21) Appl. No.: 11/230,531

(22) Filed: Sep. 21, 2005

(65) Prior Publication Data

US 2006/0061386 A1 Mar. 23, 2006

(30) Foreign Application Priority Data

Sep. 21, 2004 (JP) ............................. 2004-273007  
Jun. 16, 2005 (JP) ............................. 2005-176591

(51) Int. Cl.  
*H03K 19/0175* (2006.01)  
*H03K 19/094* (2006.01)

(52) U.S. Cl. .............................. 326/68; 326/63; 326/81; 326/83; 327/33

(58) Field of Classification Search .................. 326/63, 326/68, 81, 83; 327/33

See application file for complete search history.

(56) References Cited

U.S. PATENT DOCUMENTS 5,469,080 A * 11/1995 Son .............................. 326/81  
6,480,050 B1 * 11/2002 Barnes ........................ 327/333

FOREIGN PATENT DOCUMENTS

| JP | 5-308274 | 11/1993 |
|----|----------|---------|
| JP | 6-209256 | 7/1994 |
| JP | 7-86913 | 3/1995 |

* cited by examiner

*Primary Examiner*—Rexford Barnie  
*Assistant Examiner*—Matthew C Tabler  
(74) *Attorney, Agent, or Firm*—Buchanan Ingersoll & Rooney PC (57) ABSTRACT

In a level conversion circuit, two P channel MOS transistors form a current mirror circuit. When an input signal rises from the "L" level to the "H" level, an N channel MOS transistor connected to a drain of one P channel MOS transistor is brought out of conduction to prevent a leak current from flowing through two P channel MOS transistors, which decreases a power consumption. In addition, when the input signal rises from the "L" level to the "H" level, a P channel MOS transistor connected to a drain of the other P channel MOS transistor is brought into conduction to fix a potential of a node of the drain of the other P channel MOS transistor to the "H" level, which prevents the potential of the node from becoming unstable.

12 Claims, 10 Drawing Sheets

LEVEL CONVERSION CIRCUIT FOR CONVERTING VOLTAGE AMPLITUDE OF SIGNAL

BACKGROUND OF THE INVENTION

1. Field of the Invention

The present invention relates to a level conversion circuit and, more specifically, to a level conversion circuit for converting a voltage amplitude of a signal.

2. Description of the Background Art

In recent years, higher integration, size reduction, speeding-up of operations, and a decreased power consumption of a semiconductor device have been further required. Particularly in an LSI (Large Scale Integrated circuit), a decreased voltage of an internal power supply and speeding-up of an operation are both required. A voltage of the internal power supply of the LSI is currently decreased more than an interface voltage of the LSI. Thus, a level conversion circuit is used to convert a voltage amplitude of an output signal of the LSI when a plurality of LSIs are connected to each other. The level conversion circuit is also used when circuits having different power supply voltages are connected to each other in the LSI.

A conventional level conversion circuit for converting a signal having the "L" level of a ground potential GND (0 V) and the "H" level of a power supply potential VDDL (for example, 1.2 V) into a signal having the "L" level of ground potential GND (0 V) and the "H" level of a power supply potential VDDH (for example, 3.3 V) requires a long time to perform a level conversion operation and consumes a large power. In addition, it is difficult to equalize a time required to perform the level conversion operation when an input signal rises from the "L" level to the "H" level with a time required when the input signal falls from the "H" level to the "L" level. When there is a large difference between power supply potential VDDL and power supply potential VDDH, times required for the level conversion operations tend to differ from each other.

Japanese Patent Laying-Open No. 06-209256 discloses a level conversion circuit which can convert 5 V into 1-7 V, and 1-7 V into 5 V. This level conversion circuit has an improved β value (a current amplification factor) of a transistor forming the level conversion circuit.

In addition, Japanese Patent Laying-Open No. 07-086913 discloses a pulse level conversion circuit with reduced current consumption. This pulse level conversion circuit can prevent degradation of a high amplitude output pulse by setting a delay time required for a potential of an output node rising to a high potential.

In addition, Japanese Patent Laying-Open No. 05-308274 discloses a CMOS level shift circuit capable of obtaining a signal output of a high voltage level and a constant current with a circuit construction including an MOS transistor having a small withstand voltage between the gate and a source.

Speeding-up of a level conversion operation and a decreased power consumption, however, are not sufficiently attained with each of Japanese Patent Laying-Open Nos. 06-209256 and 05-308274. In addition, the level conversion circuit of Japanese Patent Laying-Open No. 07-086913 has low versatility because it cannot handle an input signal having a level varying at a low speed.

SUMMARY OF THE INVENTION

A main object of the present invention is to provide a level conversion circuit enabling a high-speed level conversion operation with a low power consumption and having high versatility.

A level conversion circuit according to the present invention includes a first transistor of a first conductivity form having a first electrode receiving a second power supply potential and a gate electrode and a second electrode connected to each other, a second transistor of a first conductivity form having a first electrode receiving the second power supply potential, a gate electrode connected to the gate electrode of the first transistor and a second electrode connected to a prescribed node, a third transistor of a second conductivity form having a gate electrode receiving a first signal, a first switching element connected between the second electrode of the first transistor and a line of a reference potential in series with the third transistor, a fourth transistor of a second conductivity form having a first electrode connected to the prescribed node, a gate electrode receiving an inverted signal of the first signal and a second electrode receiving the reference potential, a second switching element connected between a line of the second power supply potential and the prescribed node, and an output circuit for bringing the first switching element into conduction and the second switching element out of conduction to set the output node to the reference potential when a potential of the prescribed node is lower than a prescribed level and for bringing the first switching element out of conduction and the second switching element into conduction to set the output node to the second power supply potential when the potential of the prescribed node is higher than the prescribed level. Therefore, with the first and second transistors forming a current mirror circuit and the first and second switching elements provided, speeding-up of the level conversion operation and a decreased power consumption can be attained. In addition, versatility of the level conversion circuit is increased because the first signal having a level varying at either a low speed or a high speed can be handled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
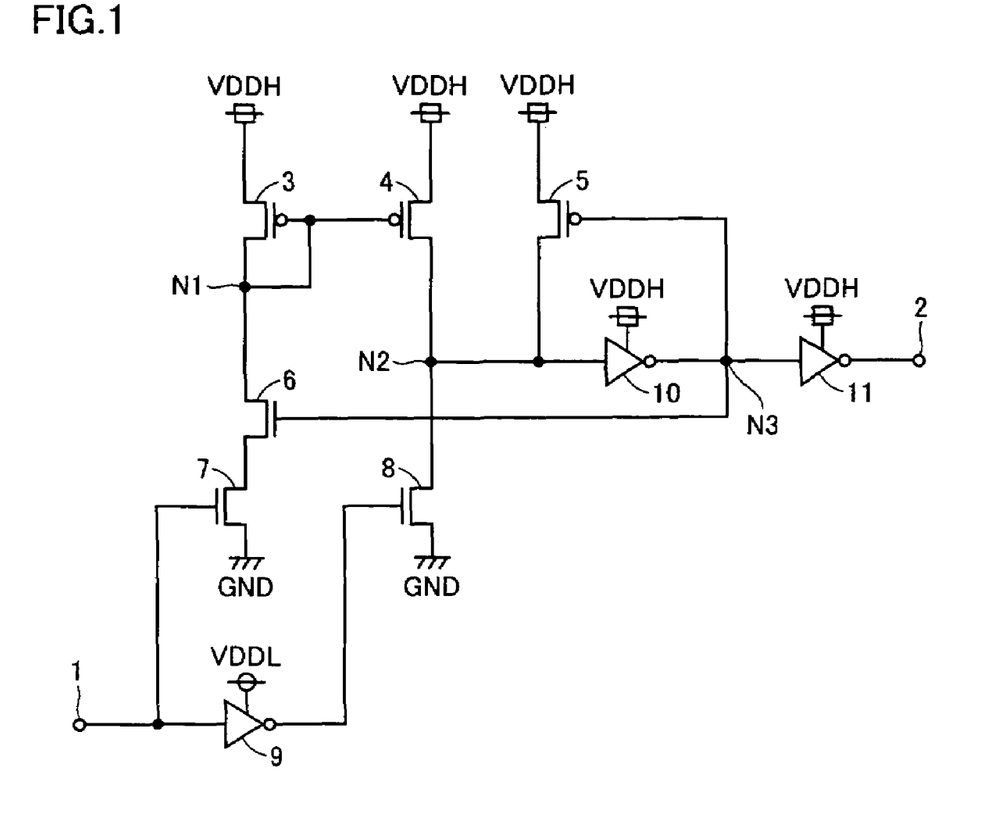
FIG. 1 is a circuit diagram of a construction of a level conversion circuit according to a first embodiment of the present invention.

Referring to FIG. 1, a level conversion circuit includes an input terminal 1, an output terminal 2, P channel MOS transistors 3-5, N channel MOS transistors 6-8, and inverters 9-11.

P channel MOS transistor 3 is connected between a line of a power supply potential VDDH and a node N1. P channel MOS transistor 4 is connected between the line of power supply potential VDDH and a node N2. The gates of P channel MOS transistors 3, 4 are both connected to node N1. P channel MOS transistors 3, 4 form a current mirror circuit and, when a current flows through P channel MOS transistor 3, a current of a value corresponding to element dimensions of P channel MOS transistors 3, 4 flows through P channel MOS transistor 4.

N channel MOS transistors 6, 7 are connected in series between node N1 and a line of a ground potential GND. N channel MOS transistor 8 is connected between node N2 and the line of ground potential GND. Input terminal 1 is connected to the gate of N channel MOS transistor 7, and is also connected to the gate of N channel MOS transistor 8 via inverter 9.

Inverters 10, 11 are connected in series between node N2 and output terminal 2. P channel MOS transistor 5 is connected between the line of power supply potential VDDH and node N2. A node N3 between inverters 10 and 11 is connected to the gate of P channel MOS transistor 5 and to the gate of N channel MOS transistor 6. Inverters 10, 11 form an output circuit for performing ON/OFF controls of P channel MOS transistor 5 and N channel MOS transistor 6 and switching a logic level of an output signal according to a potential of node N2.

Power supply potential VDDH is a high potential (for example, 3.3 V) and a power supply potential VDDL is a low potential (for example, 1.2 V). Inverter 9 is driven with power supply potential VDDL and inverters 10, 11 are driven with power supply potential VDDH. Each of inverters 9-11 inverts a logic level of a signal input and outputs the result.

Figure 2:
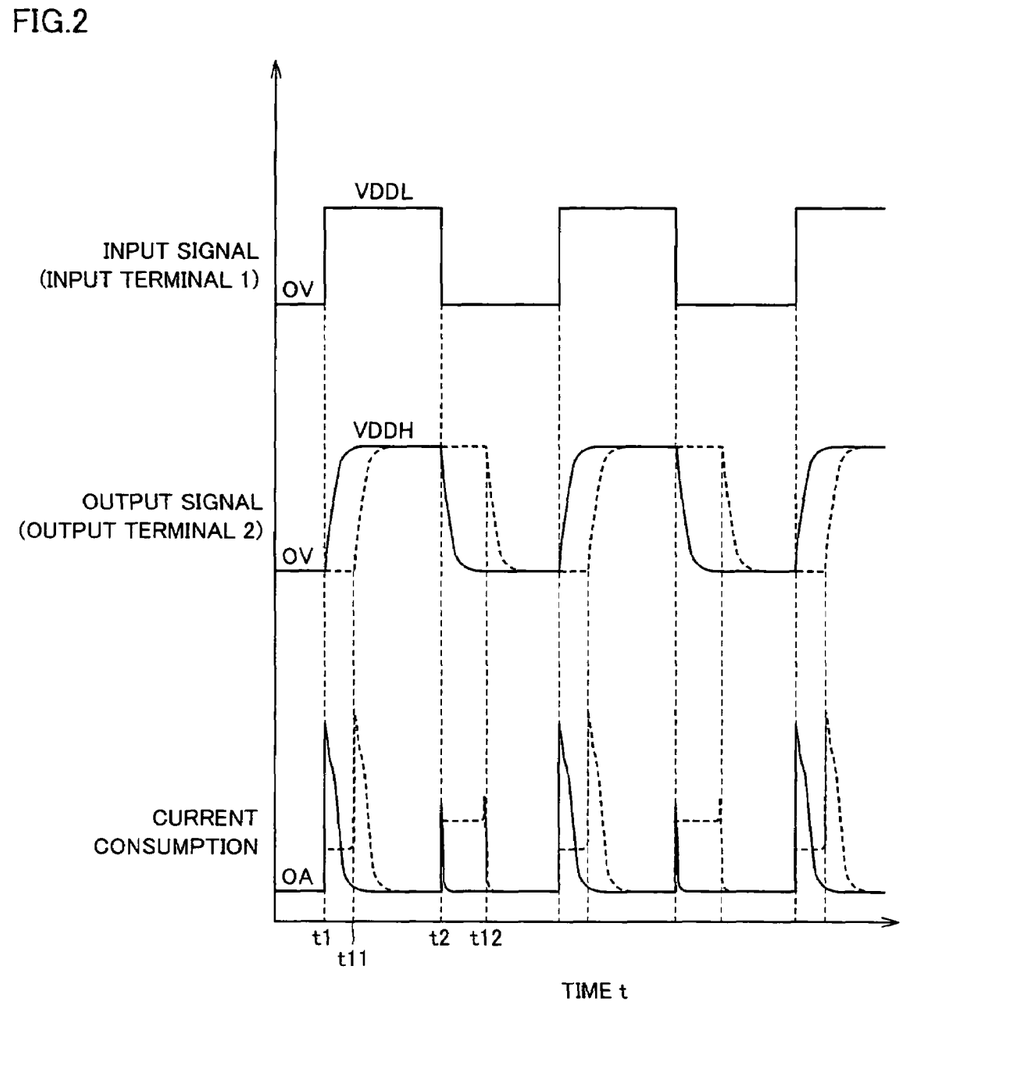
FIG. 2 is a time chart of an operation of the level conversion circuit shown in FIG. 1.

FIG. 2 shows variations in potentials of an input signal and an output signal and a variation in a current consumption of the level conversion circuit shown in FIG. 1. The current consumption indicated here is a result of a simulation in which a frequency of the input signal is set to 25 MHz and an additive capacity of output terminal 2 is set to 1 pF.

At a time t1, the input signal rises from the "L" level (0 V) to the "H" level (VDDL). Accordingly, N channel MOS transistor 7 is brought into conduction and N channel MOS transistor 8 is brought out of conduction.

When a potential of node N3 is at the "H" level at time t1, a potential of node N1 decreases because N channel MOS transistor 6 is conducting, and a current flows through P channel MOS transistor 3. Accordingly, a current flows through P channel MOS transistor 4. In addition, a potential of node N2 increases because N channel MOS transistor 8 is not conducting. When the potential of node N2 becomes higher than a threshold voltage of inverter 10, inverter 10 makes the potential of node N3 fall to the "L" level (0 V), and inverter 11 makes the potential of output terminal 2 rise to the "H" level (VDDH). Furthermore, in response to the potential of node N3 falling to the "L" level, P channel MOS transistor 5 is brought into conduction and the potential of node N2 is set to the "H" level (VDDH). In addition, N channel MOS transistor 6 is brought out of conduction and currents flowing through P channel MOS transistors 3, 4 become 0 A. Therefore, the current consumption of the level conversion circuit momentarily increases at time t1 and then decreases to 0 A.

Though not shown in the drawing, when the potential of node N3 is at the "L" level at time t1, currents do not flow through P channel MOS transistors 3, 4 because N channel MOS transistor 6 is not conducting, but the potential of node N2 is set to the "H" level (VDDH) because P channel MOS transistor 5 is conducting. Therefore, inverter 10 sets the potential of node N3 to the "L" level (0 V), and inverter 11 sets the potential of output terminal 2 to the "H" level (VDDH).

Then, at a time t2, the input signal falls from the "H" level (VDDL) to the "L" level (0 V). Accordingly, N channel MOS transistor 7 is brought out of conduction and N channel MOS transistor 8 is brought into conduction. Since N channel MOS transistor 7 is brought out of conduction, currents do not flow through P channel MOS transistors 3, 4 regardless of a conduction state of N channel MOS transistor 6. In this situation, the potential of node N2 falls to the "L" level (0 V) in response to N channel MOS transistor 8 brought into conduction. Accordingly, inverter 10 makes the potential of node N3 rise to the "H" level (VDDH), and inverter 11 makes the potential of output terminal 2 fall to the "L" level (0 V). Furthermore, in response to the potential of node N3 rising to the "H" level, P channel MOS transistor 5 is brought out of conduction. In addition, N channel MOS transistor 6 is brought into conduction to be ready for an operation when the input signal rises from the "L" level (0 V) to the "H" level (VDDL) next time. Therefore, the current consumption of the level conversion circuit momentarily increases at time t2 and then decreases to 0 A.

Figure 3:
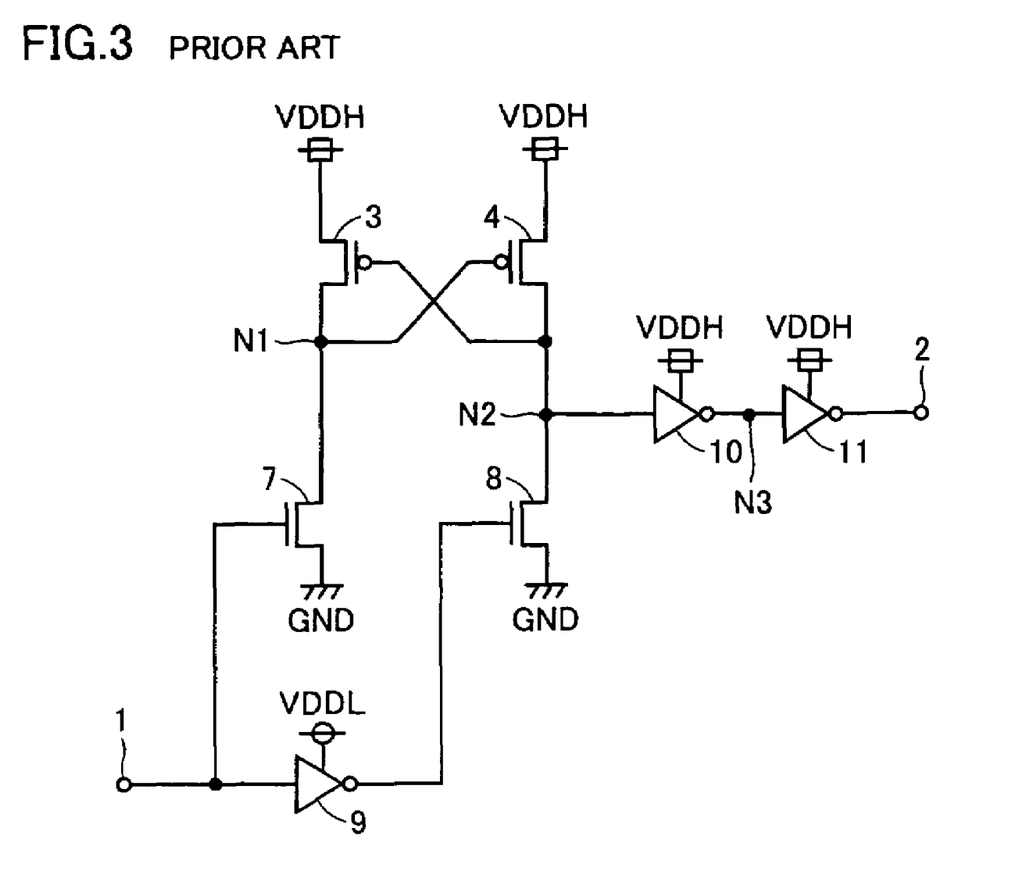
FIG. 3 is a circuit diagram of a construction of a conventional level conversion circuit.

FIG. 3 is a circuit diagram of a construction of a conventional level conversion circuit, which is compared with FIG. 1. Referring to FIG. 3, the level conversion circuit of FIG. 3 is different from the level conversion circuit of FIG. 1 in that, N channel MOS transistor 6 and P channel MOS transistor 5 are deleted and the gate of P channel MOS transistor 3 is connected to node N2. It is to be noted that, portions of FIG. 3 corresponding to those of FIG. 1 are indicated with the same characters and detailed descriptions thereof will not be repeated.

Referring back to FIG. 2, dotted lines indicate a variation in a potential of an output signal and a variation in a current consumption of the conventional level conversion circuit. At time t1, an input signal rises from the "L" level (0 V) to the "H" level (VDDL). Accordingly, N channel MOS transistor 7 is brought into conduction and N channel MOS transistor 8 is brought out of conduction. The potential of node N1 decreases in response to N channel MOS transistor 7 brought into conduction, and a current flows through P channel MOS transistor 4. In this situation, the potential of node N2 increases because N channel MOS transistor 8 is not conducting. Accordingly, P channel MOS transistor 3 is brought out of conduction and the potential of node N1 decreases to the "L" level (0 V). In addition, the current flowing through P channel MOS transistor 4 increases and the potential of node N2 increases to the "H" level (VDDH).

At a time t11 after a prescribed time from time t1, in response to the potential of node N2 becoming higher than the threshold voltage of inverter 10, inverter 10 makes the potential of node N3 fall to the "L" level (0 V) and inverter 11 makes the potential of output terminal 2 rise to the "H" level (VDDH). Therefore, the current consumption of the level conversion circuit is kept at a prescribed level from time t1 to time t11, momentarily increases at time t11, and then decreases to 0 A.

Then, at time t2, the input signal falls from the "H" level (VDDL) to the "L" level (0 V). Accordingly, N channel MOS transistor 7 is brought out of conduction and N channel MOS transistor 8 is brought into conduction. In response to N channel MOS transistor 8 brought into conduction, the potential of node N2 decreases and a current flows through P channel MOS transistor 3. In this situation, the potential of node N1 increases because N channel MOS transistor 7 is not conducting. Accordingly, P channel MOS transistor 4 is brought out of conduction and the potential of node N2 decreases to the "L" level (0 V). In addition, the current flowing through P channel MOS transistor 3 increases and the potential of node N1 increases to the "H" level (VDDH).

At a time t12 after a prescribed time from time t2, in response to the potential of node N2 becoming lower than the threshold voltage of inverter 10, inverter 10 makes the potential of node N3 rise to the "H" level (VDDH) and inverter 11 makes the potential of output terminal 2 fall to the "L" level (0 V). Therefore, the current consumption of the level conversion circuit is kept at a prescribed level from time t2 to time t12, momentarily increases at time t12, and then decreases to 0 A.

Therefore, the conventional level conversion circuit requires a long time for a level conversion operation and consumes a large power. Furthermore, it is difficult to equalize a time required to switch the logic level of the output signal when the input signal rises from the "L" level to the "H" level (t11-t1) with a time required to switch the logic level of the output signal when the input signal falls from the "H" level to the "L" level (t12-t2) for the following reason.

To bring N channel MOS transistor 7 into conduction and to decrease the potential of node N1 when the input signal rises from the "L" level to the "H" level at time t1, a current driving capability of N channel MOS transistor 7 must be made larger than that of P channel MOS transistor 3. This is because, momentarily at time t1, both of P channel MOS transistor 3 and N channel MOS transistor 7 are in a conducting state since P channel MOS transistor 3 is conducting in a period until time t1.

In addition, to bring N channel MOS transistor 8 into conduction and to decrease the potential of node N2 when the input signal falls from the "H" level to the "L" level at time t2, a current driving capability of N channel MOS transistor 8 must be made larger than that of P channel MOS transistor 4. This is because, momentarily at time t2, both of P channel MOS transistor 4 and N channel MOS transistor 8 are in a conducting state since P channel MOS transistor 4 is conducting in a period from time t1 to time t2.

Because of the current driving capability of each transistor varied as such, however, properties of the level conversion operations differ in a situation of the input signal rising from the "L" level to the "H" level and in a situation of the input signal falling from the "H" level to the "L" level. Thus, times required for the level conversion operations tend to differ from each other when there is a large difference between power supply potential VDDL and power supply potential VDDH.

Therefore, in a first embodiment, P channel MOS transistors 3, 4 form the current mirror circuit and N channel MOS transistor 6 and P channel MOS transistor 5 are added. With this, speeding-up of the level conversion operations and a decreased power consumption can be attained as compared with the conventional level conversion circuit (see FIG. 2). More specifically, since N channel MOS transistor 6 is brought out of conduction when the input signal rises from the "L" level to the "H" level, flowing of leak currents through P channel MOS transistors 3, 4 is prevented and a power consumption is decreased. In addition, since the potential of node N2 is fixed to the "H" level (VDDH) with P channel MOS transistor 5 brought into conduction when the input signal rises from the "L" level to the "H" level, the potential of node N2 is prevented from becoming unstable. This is effective for application to an LSI having a function of shifting from a normal operation mode to a low power consumption mode. That is, a low current consumption and a high-speed response are enabled for the input signal having a level varying at either a low speed (a signal of a low frequency) or a high speed (a signal of a high frequency), which increases versatility of the level conversion circuit.

It is to be noted that, the current driving capability of P channel MOS transistor 5 is made sufficiently lower than that of N channel MOS transistor 8 to avoid affecting a speed of the level conversion operation. With this, the potential of node N2 rapidly decreases when the input signal falls from the "H" level to the "L" level and N channel MOS transistor 8 is brought into conduction.

Though a situation of N channel MOS transistor 6 provided between P channel MOS transistor 3 and N channel MOS transistor 7 is described here, N channel MOS transistor 6 may be provided between N channel MOS transistor 7 and the line of ground potential GND. A similar effect can be obtained in this situation.

Furthermore, though a situation of inverter 9 provided between input terminal 1 and the gate of N channel MOS transistor 8 is described here, inverter 9 may be provided between input terminal 1 and the gate of N channel MOS transistor 7. A similar effect can be obtained in this situation.

Figure 4:
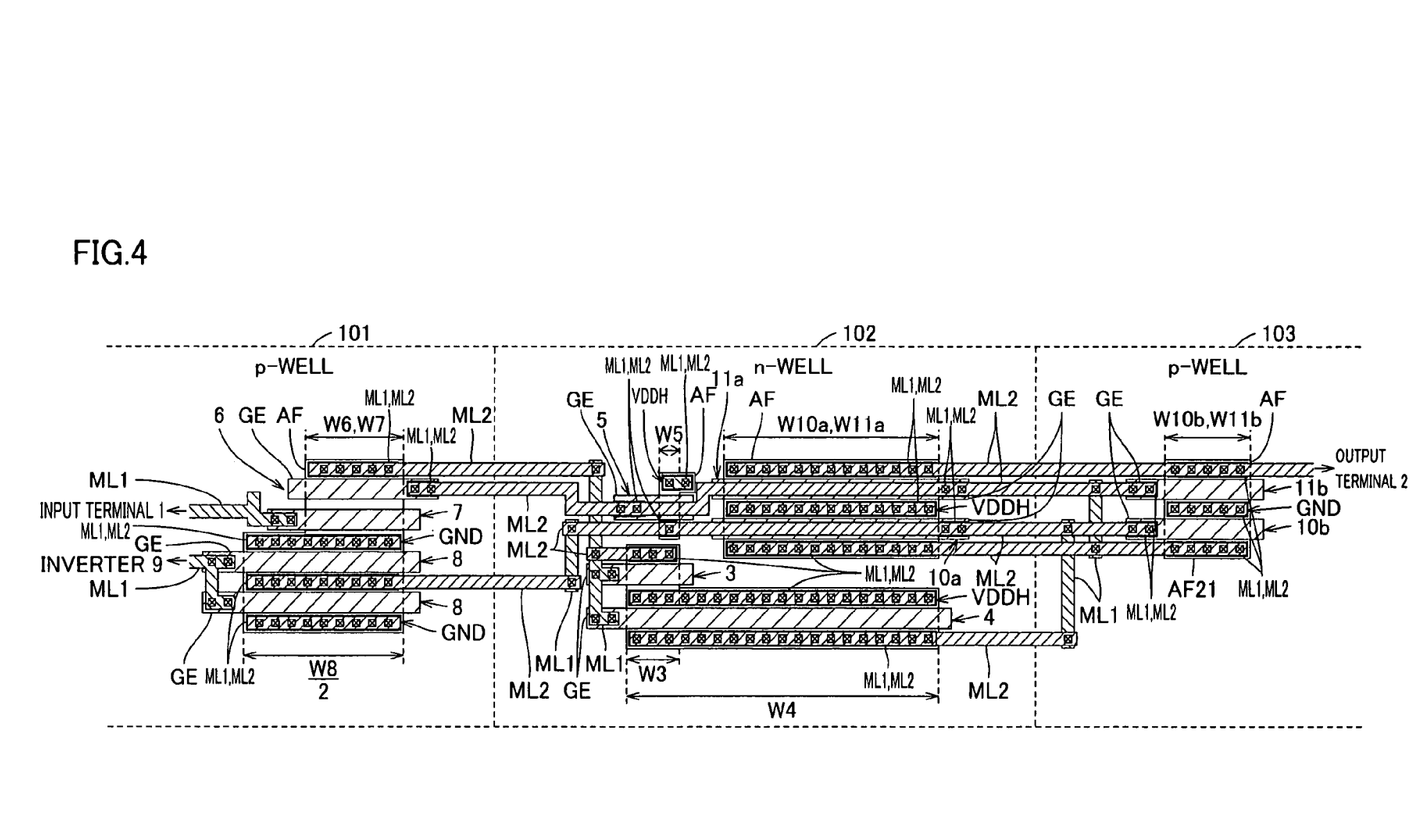
FIG. 4 is a plan view of a layout of the level conversion circuit shown in FIG. 1.

FIG. 4 is a plan view of a layout of the level conversion circuit shown in FIG. 1. In FIG. 4, N channel MOS transistors 6, 7, 8 are arranged in a p-well region 101. P channel MOS transistors 3, 4, 5 and P channel MOS transistors 10a, 11a forming inverters 10, 11 are arranged in an n-well region 102. N channel MOS transistors 10b, 11b forming inverters 10, 11 are arranged in a p-well region 103. An active region AF, a gate electrode GE, a first metal interconnection layer ML1, and a second metal interconnection layer ML2 are formed in each of p-well regions 101, 103 and n-well region 102. The first and second metal interconnection layers are, for example, aluminum interconnections.

In p-well region 101, gate electrode GE of N channel MOS transistor 6 is connected to gate electrode GE of P channel MOS transistor 5 via first and second metal interconnection layers ML1, ML2. A drain of N channel MOS transistor 6 is connected to gate electrode GE of P channel MOS transistor 3 via first and second metal interconnection layers ML1, ML2, and a source of N channel MOS transistor 6 is connected to a drain of N channel MOS transistor 7. Gate electrode GE of N channel MOS transistor 7 is connected to input terminal 1 via first metal interconnection layer ML1. A source of N channel MOS transistor 7 is connected to the line of ground potential GND via first and second metal interconnection layers ML1, ML2. Gate electrode GE of N channel MOS transistor 8 is connected to an output node of inverter 9 via first metal interconnection layer ML1. A drain of N channel MOS transistor 8 is connected to a drain of P channel MOS transistor 5 via first and second metal interconnection layers ML1, ML2, and a source of N channel MOS transistor 8 is connected to the line of ground potential GND via first and second metal interconnection layers ML1, ML2. N channel MOS transistor 8 is arranged in two columns.

In n-well region 102, gate electrode GE of P channel MOS transistor 5 is connected to gate electrode GE of P channel MOS transistor 11a forming inverter 11 via first and second metal interconnection layers ML1, ML2. A source of P channel MOS transistor 5 is connected to the line of power supply potential VDDH via first and second metal interconnection layers ML1, ML2, and a drain of P channel MOS transistor 5 is connected to gate electrode GE of P channel MOS transistor 10a forming inverter 10 via first and second metal interconnection layers ML1, ML2. Gate electrode GE of P channel MOS transistor 3 is connected to a drain thereof via first and second metal interconnection layers ML1, ML2. A source of P channel MOS transistor 3 is connected to the line of power supply potential VDDH via first and second metal interconnection layers ML1, ML2. Gate electrode GE of P channel MOS transistor 4 is connected to gate electrode GE of P channel MOS transistor 3 via first metal interconnection layer ML1. A source of P channel MOS transistor 4 is connected to the line of power supply potential VDDH via first and second metal interconnection layers ML1, ML2, and a drain of P channel MOS transistor 4 is connected to gate electrode GE of P channel MOS transistor 10a forming inverter 10 via first and second metal interconnection layers ML1, ML2.

In n-well region 102 and p-well region 103, gate electrode GE of P channel MOS transistor 10a forming inverter 10 is connected to gate electrode GE of N channel MOS transistor 10b via first and second metal interconnection layers ML1, ML2. A source of P channel MOS transistor 10a is connected to the line of power supply potential VDDH via first and second metal interconnection layers ML1, ML2, and a drain of P channel MOS transistor 10a is connected to a drain of N channel MOS transistor 10b via first and second metal interconnection layers ML1, ML2. A source of N channel MOS transistor 10b is connected to the line of ground potential GND via first and second metal interconnection layers ML1, ML2. Gate electrode GE of P channel MOS transistor 11a forming inverter 11 is connected to gate electrode GE of N channel MOS transistor 11b via first and second metal interconnection layers ML1, ML2. A source of P channel MOS transistor 11a is connected to the line of power supply potential VDDH via first and second metal interconnection layers ML1, ML2, and a drain of P channel MOS transistor 11a is connected to a drain of N channel MOS transistor 11b via first and second metal interconnection layers ML1, ML2. A source of N channel MOS transistor 11b is connected to the line of ground potential GND via first and second metal interconnection layers ML1, ML2, and a drain of N channel MOS transistor 11b is connected to output terminal 2.

All of gate electrodes GEs of the transistors are arranged in the same direction (a horizontal direction in the drawing). With this, variations in manufacturing of transistors can be decreased.

Though not shown in the drawing, a P channel MOS transistor 9a and an N channel MOS transistor 9b forming inverter 9 are arranged in another region. Inverter 9 uses a power supply system of power supply potential VDDL, which is different from a power supply system of power supply potential VDDH.

Herein, it is assumed that transistors 3-8 have respective gate lengths of L3-L8, transistors 10a, 10b, 11a, 11b have respective gate lengths of L10a, L10b, L11a, L11b, transistors 3-8 have respective gate widths of W3-W8, and transistors 10a, 10b, 11a, 11b have respective gate widths of W10a, W10b, W11a, W11b.

Figure 5:
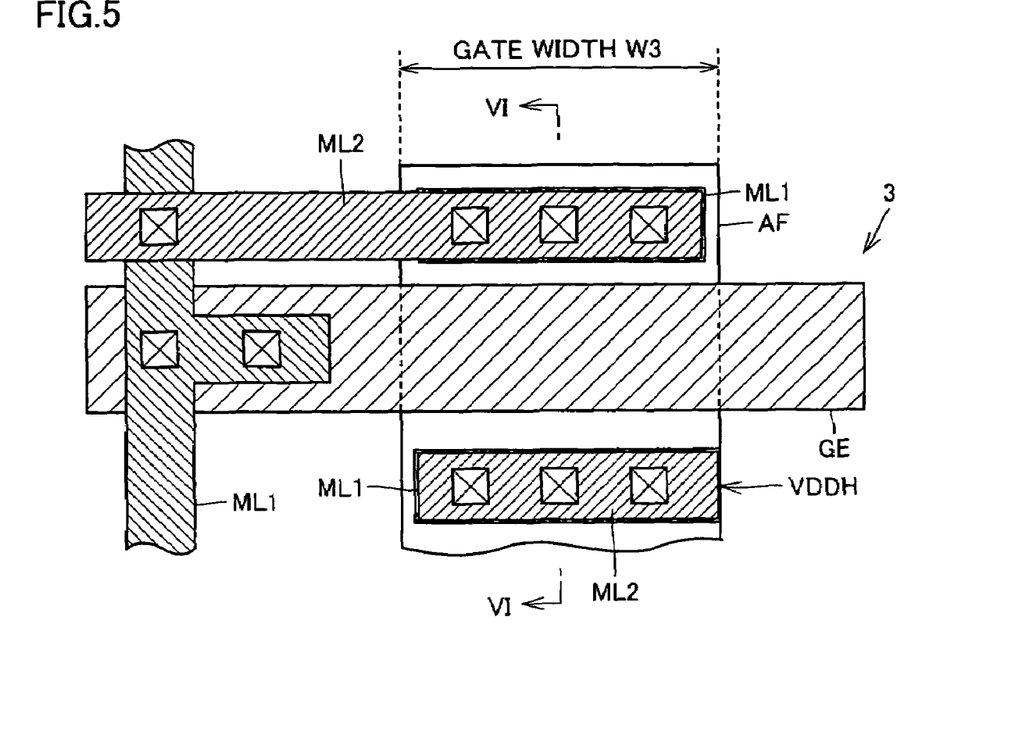
FIG. 5 is a partial enlarged view of a P channel MOS transistor 3 shown in FIG. 4.

FIG. 5 is a partial enlarged view of P channel MOS transistor 3 shown in FIG. 4. Referring to FIG. 5, gate width W3 of P channel MOS transistor 3 corresponds to a length (a length in a horizontal direction in FIG. 5) of an overlapping portion of gate electrode GE of P channel MOS transistor 3 and active region AF.

Figure 6:
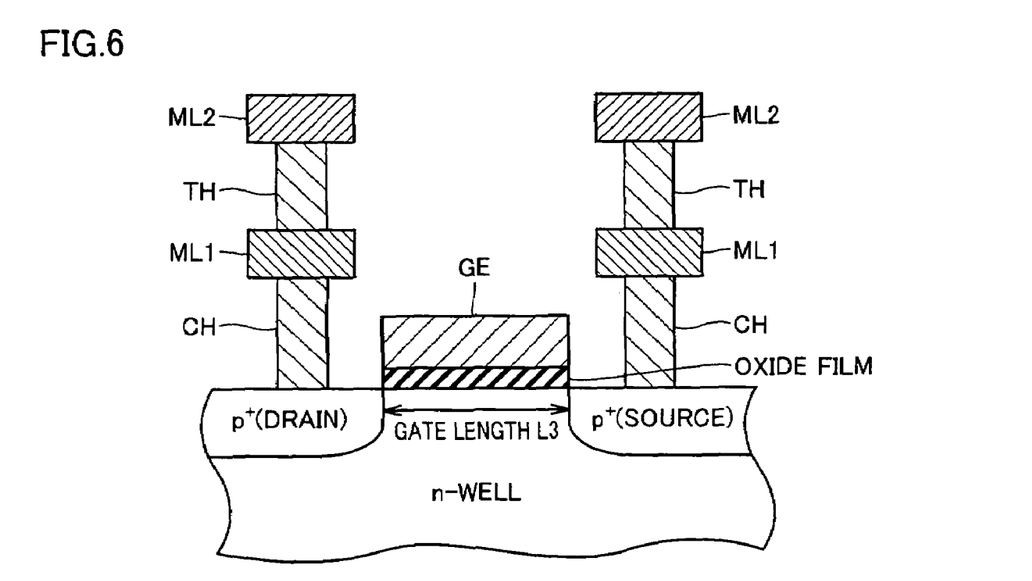
FIG. 6 is a cross-sectional view taken along the line VI-VI of FIG. 5.

FIG. 6 is a cross-sectional view taken along the line VI-VI of FIG. 5. Referring to FIG. 6, a source and a drain, which are p+ regions, are formed on an n-well 102. An oxide film is further stacked on n-well 102, and gate electrode GE such as polysilicon is stacked on the oxide film. First metal interconnection layer ML1 is formed above each of the source and drain of the p+ regions with a contact hole CH interposed therebetween. Furthermore, second metal interconnection layer ML2 is formed above first metal interconnection layer ML1 with a through hole TH interposed therebetween. Gate length L3 of P channel MOS transistor 3 corresponds to a distance between the source and drain of the p+ regions.

Table 1 shows an example of a gate length and a gate width of each transistor shown in FIG. 4. Transistors 9a, 9b respectively indicate P channel MOS transistor 9a and N channel MOS transistor 9b forming inverter 9 shown in FIG. 1.

TABLE 1

|  | Gate Width W (μm) | Gate Length L (μm) |
| --- | --- | --- |
| Transistor 3 | 1.0 | 0.4 |
| Transistor 4 | 7.0 | 0.4 |
| Transistor 5 | 0.4 | 0.5 |
| Transistor 6 | 2.0 | 0.4 |
| Transistor 7 | 2.0 | 0.4 |
| Transistor 8 | 7.0 | 0.4 |
| Transistor 9a | 3.36 | 0.1 |
| Transistor 9b | 1.3 | 0.1 |
| Transistor 10a | 4.9 | 0.4 |
| Transistor 10b | 2.1 | 0.4 |
| Transistor 11a | 4.9 | 0.4 |
| Transistor 11b | 2.1 | 0.4 |

Referring to Table 1, gate width W4 (for example, 7.0 μm) of P channel MOS transistor 4 is made larger than gate width W3 (for example, 1.0 μm) of P channel MOS transistor 3, preferably by about 3-8 times. With this, an input current is amplified to an appropriate level in the current mirror circuit formed with P channel MOS transistors 3, 4. In addition, gate width W8 (for example, 7.0 μm) of N channel MOS transistor 8 is made larger than gate width W7 (for example, 2.0 μm) of N channel MOS transistor 7, preferably by about 1.1-4 times. Gate width W6 of N channel MOS transistor 6 is made as large as gate width W7 of N channel MOS transistor 7 (for example, 2.0 μm).

Gate width W5 (for example, 0.4 μm) of P channel MOS transistor 5 is made sufficiently smaller than gate width W8 (for example, 7.0 μm) of N channel MOS transistor 8, preferably by about 0.03-0.2 times. In addition, gate length L5 (for example, 0.5 μm) of P channel MOS transistor 5 is made larger than gate length L8 (for example, 0.4 μm) of N channel MOS transistor 8, preferably by about 1.1-1.5 times. With this, the current driving capability of P channel MOS transistor 5 becomes sufficiently lower than that of N channel MOS transistor 8. Therefore, the potential of node N2 rapidly decreases when the input signal falls from the "H" level to the "L" level and N channel MOS transistor 8 is brought into conduction, as described above using FIG. 2.

Gate lengths L9a, L9b (for example, 0.1 μm) of P channel MOS transistor 9a and N channel MOS transistor 9b forming inverter 9 are made smaller than the gate lengths (for example, 0.4 μm) of other transistors, preferably by about 0.2-0.5 times. This is because inverter 9 uses the power supply system of power supply potential VDDL which is lower than power supply potential VDDH.

Modified Example of First Embodiment

Figure 7:
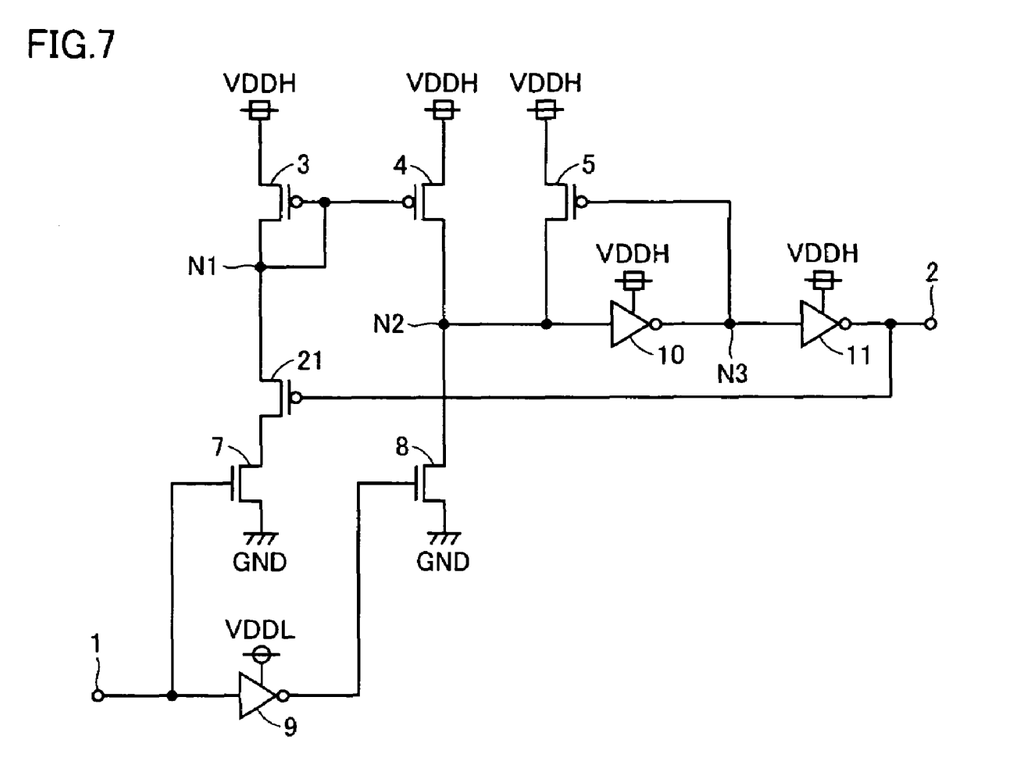
FIG. 7 is a circuit diagram of a construction of a level conversion circuit according to a modified example of the first embodiment of the present invention.

Referring to FIG. 7, a level conversion circuit of FIG. 7 is different from the level conversion circuit of FIG. 1 in that, N channel MOS transistor 6 is replaced with a P channel MOS transistor 21. It is to be noted that, portions of FIG. 7 corresponding to those of FIG. 1 are indicated with the same characters and detailed descriptions thereof will not be repeated.

P channel MOS transistor 21 has a source connected to node N1, a drain connected to the drain of N channel MOS transistor 7, and the gate connected to output terminal 2. P channel MOS transistor 21 is brought out of conduction when, in response to the input signal rising from the "L" level (0 V) to the "H" level (VDDL), the potential of output terminal 2 rises from the "L" level (0 V) to the "H" level (VDDH), and is brought into conduction when, in response to the input signal falling from the "H" level (VDDL) to the "L" level (0 V), the potential of output terminal 2 falls from the "H" level (VDDH) to the "L" level (0 V).

Therefore, the level conversion circuit shown in FIG. 7 performs a level conversion operation similar to that of the level conversion circuit shown in FIG. 1, which operation is indicated with a time chart of FIG. 2. Thus, similarly as in the first embodiment, the level conversion circuit enabling a high-speed level conversion operation with a low power consumption and having high versatility can be implemented in this modified example of the first embodiment.

Second Embodiment

Figure 8:
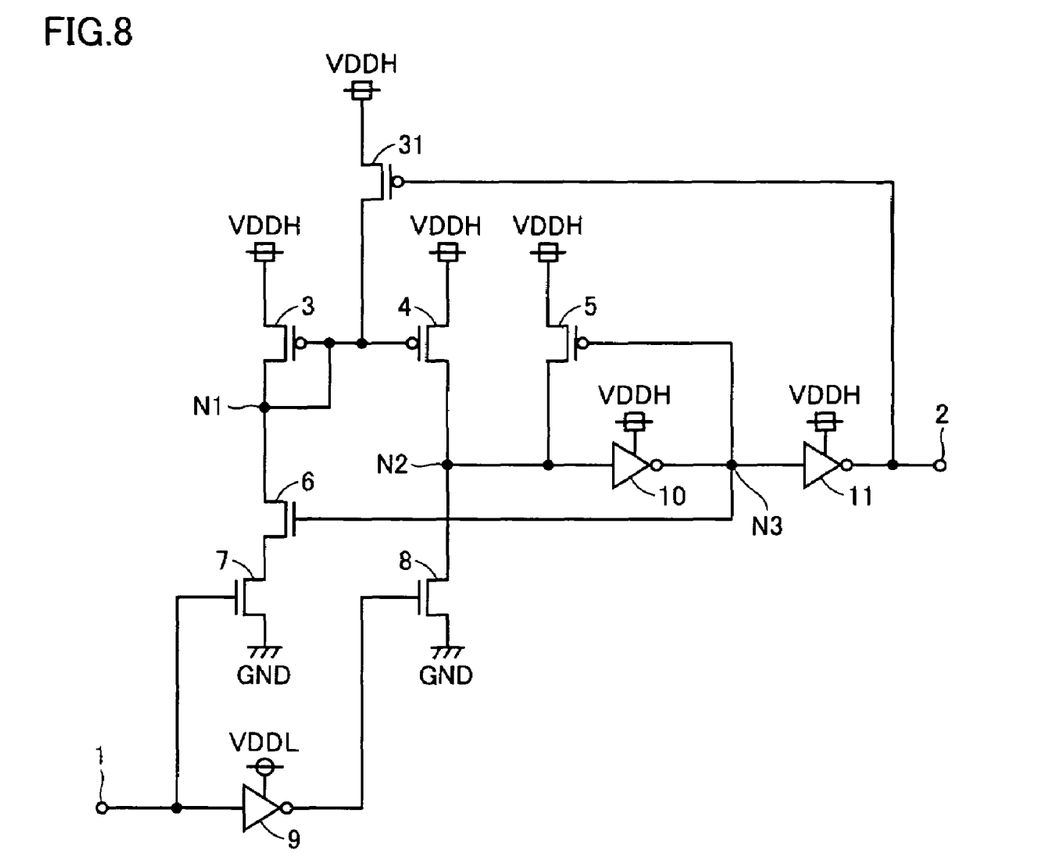
FIG. 8 is a circuit diagram of a construction of a level conversion circuit according to a second embodiment of the present invention.

Referring to FIG. 8, a level conversion circuit of FIG. 8 is different from the level conversion circuit of FIG. 1 in that, a P channel MOS transistor 31 is added. It is to be noted that, portions of FIG. 8 corresponding to those of FIG. 1 are indicated with the same characters and detailed descriptions thereof will not be repeated.

P channel MOS transistor 31 is connected between the line of power supply potential VDDH and node N1. The gate of P channel MOS transistor 31 is connected to output terminal 2. When the input signal falls from the "H" level (VDDL) to the "L" level (0 V), N channel MOS transistor 7 is brought out of conduction and N channel MOS transistor 8 is brought into conduction. Since N channel MOS transistor 7 is not conducting, currents do not flow through P channel MOS transistors 3, 4 regardless of a conduction state of N channel MOS transistor 6.

A characteristic (such as a threshold voltage) of a transistor, however, sometimes differs from a designed value due to a variation caused by a manufacturing process of the transistor or a layout of a circuit. In such situation, a small amount of leak current may flow through P channel MOS transistor 4 even when no current flows through P channel MOS transistor 3 forming the current mirror circuit.

Therefore, P channel MOS transistor 31 is provided in a second embodiment to prevent the leak current from flowing through P channel MOS transistor 4. More specifically, when the input signal falls from the "H" level (VDDL) to the "L" level (0 V), the potential of node N2 decreases in response to N channel MOS transistor 8 brought into conduction. In response to the potential of node N2 becoming lower than the threshold voltage of inverter 10, inverter 10 makes the potential of node N3 rise to the "H" level (VDDH) and inverter 11 makes the potential of output terminal 2 fall to the "L" level (0 V). Accordingly, P channel MOS transistor 31 is brought into conduction and node N1 is set to the "H" level (VDDH). With this, P channel MOS transistors 3, 4 are reliably brought out of conduction. As a result, the leak current is prevented from flowing through P channel MOS transistor 4. Therefore, a further decreased power consumption of the level conversion circuit can be attained.

It is to be noted that, a current driving capability of P channel MOS transistor 31 is made sufficiently low in order to avoid affecting a speed of the level conversion operation.

In addition, though it is described that the gate of P channel MOS transistor 31 is connected to output terminal 2, the gate of P channel MOS transistor 31 may be connected to node N2.

Figure 9:
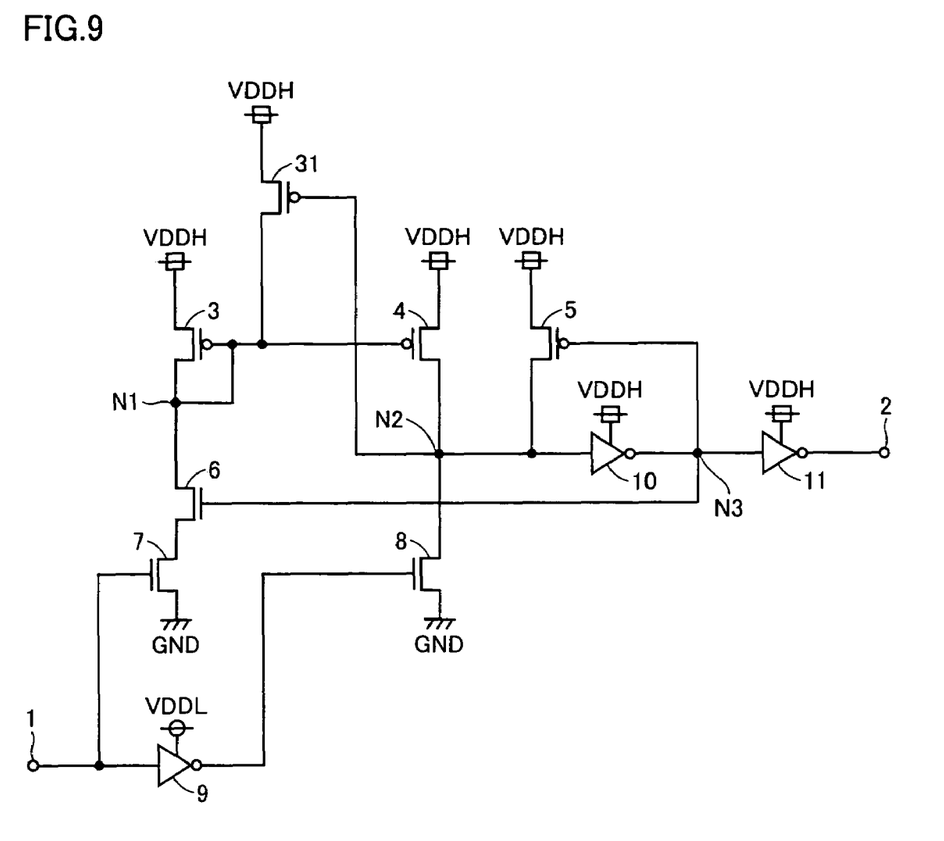
FIG. 9 is a circuit diagram of a construction of a level conversion circuit when the gate of a P channel MOS transistor 31 is connected to a node N2.

FIG. 9 is a circuit diagram of a construction of the level conversion circuit when the gate of P channel MOS transistor 31 is connected to node N2. While node N2 is connected to the gate of P channel MOS transistor 31 via inverters 10, 11 in FIG. 8, node N2 is directly connected to the gate of P channel MOS transistor 31 in FIG. 9. With this, delays due to inverters 10, 11 are eliminated and P channel MOS transistor 31 can receive feedback at an earlier stage.

Figure 10:
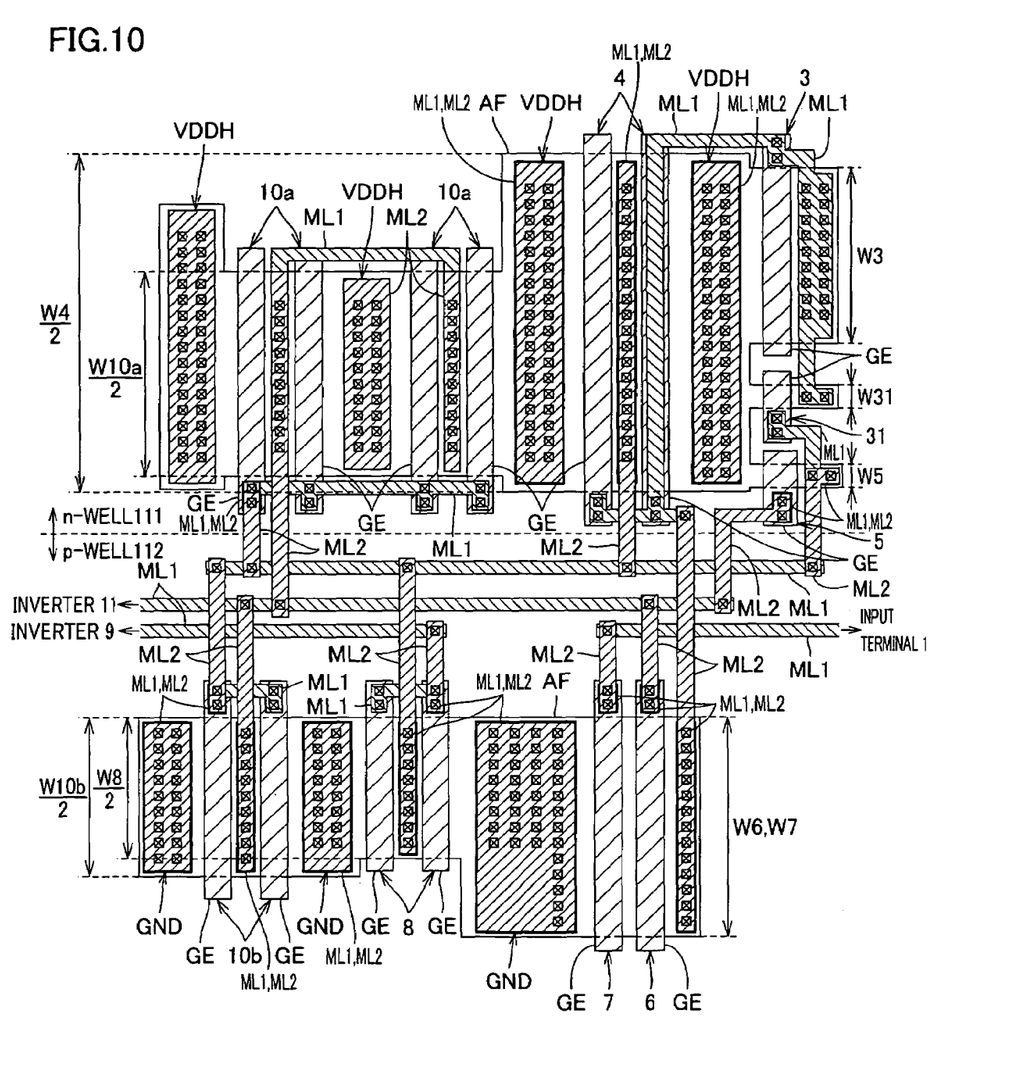
FIG. 10 is a plan view of a layout of the level conversion circuit shown in FIG. 9.

FIG. 10 is a plan view of a layout of the level conversion circuit shown in FIG. 9. In FIG. 10, P channel MOS transistors 3, 4, 5, 31 and P channel MOS transistor 10a forming inverter 10 are arranged in an n-well region 111. P channel MOS transistors 6, 7, 8 and N channel MOS transistor 10b forming inverter 10 are arranged in a p-well region 112. Active region AF, gate electrode GE, first metal interconnection layer ML1, and second metal interconnection layer ML2 are formed in each of n-well region 111 and p-well region 112. An arrangement construction of P channel MOS transistor 11a and N channel MOS transistor 11b forming inverter 11 is not described here because it is similar to that of P channel MOS transistor 10a and N channel MOS transistor 10b forming inverter 10.

In n-well region 111, gate electrode GE of P channel MOS transistor 3 is connected to the drain thereof via first metal interconnection layer ML1. The source of P channel MOS transistor 3 is connected to the line of power supply potential VDDH via first and second metal interconnection layers ML1, ML2. Gate electrode GE of P channel MOS transistor 4 is connected to gate electrode GE of P channel MOS transistor 3 via first metal interconnection layer ML1. The source of P channel MOS transistor 4 is connected to the line of power supply potential VDDH via first and second metal interconnection layers ML1, ML2, and the drain of P channel MOS transistor 4 is connected to the drain of N channel MOS transistor 8 via first and second metal interconnection layers ML1, ML2.

Gate electrode GE of P channel MOS transistor 5 is connected to gate electrode GE of N channel MOS transistor 6 via first and second metal interconnection layers ML1, ML2. The source of P channel MOS transistor 5 is connected to the line of power supply potential VDDH via first and second metal interconnection layers ML1, ML2, and the drain of P channel MOS transistor 5 is connected to the drain of P channel MOS transistor 4 via first and second metal interconnection layers ML1, ML2. Gate electrode GE of P channel MOS transistor 31 is connected to the drain of P channel MOS transistor 5 via first metal interconnection layer ML1. A source of P channel MOS transistor 31 is connected to the line of power supply potential VDDH via first and second metal interconnection layers ML1, ML2, and a drain of P channel MOS transistor 31 is connected to the drain of P channel MOS transistor 3 via first metal interconnection layer ML1.

In n-well region 111 and p-well region 112, gate electrode GE of P channel MOS transistor 10a forming inverter 10 is connected to gate electrode GE of N channel MOS transistor 10b via first and second metal interconnection layers ML1, ML2. The source of P channel MOS transistor 10a is connected to the line of power supply potential VDDH via first and second metal interconnection layers ML1, ML2, and the drain of P channel MOS transistor 10a is connected to the drain of N channel MOS transistor 10b via first and second metal interconnection layers ML1, ML2 and also to an input node of inverter 11. The source of N channel MOS transistor 10b is connected to the line of ground potential GND via first and second metal interconnection layers ML1, ML2. P channel MOS transistor 10a is arranged in four columns, and N channel MOS transistor 10b is arranged in two columns.

In p-well region 112, gate electrode GE of N channel MOS transistor 6 is connected to the drain of N channel MOS transistor 10b via first and second metal interconnection layers ML1, ML2. The drain of N channel MOS transistor 6 is connected to gate electrode GE of P channel MOS transistor 4 via first and second metal interconnection layers ML1, ML2, and the source of N channel MOS transistor 6 is connected to the drain of N channel MOS transistor 7. Gate electrode GE of N channel MOS transistor 7 is connected to input terminal 1 via first and second metal interconnection layers ML1, ML2. The source of N channel MOS transistor 7 is connected to the line of ground potential GND via first and second metal interconnection layers ML1, ML2. Gate electrode GE of N channel MOS transistor 8 is connected to the output node of inverter 9 via first and second metal interconnection layers ML1, ML2. The drain of N channel MOS transistor 8 is connected to the drain of P channel MOS transistor 4 via first and second metal interconnection layers ML1, ML2, and the source of N channel MOS transistor 8 is connected to the line of ground potential GND via first and second metal interconnection layers ML1, ML2.

All of gate electrodes GEs of the transistors are arranged in the same direction (a vertical direction in the drawing). With this, variations in manufacturing of transistors can be decreased.

Table 2 shows an example of a gate length and a gate width of each transistor shown in FIG. 10. Transistors 9a, 9b respectively indicate P channel MOS transistor 9a and N channel MOS transistor 9b forming inverter 9 shown in FIG. 9. In addition, transistors 11a, 11b respectively indicate P channel MOS transistor 11a and N channel MOS transistor 11b forming inverter 11 shown in FIG. 9.

TABLE 2

|  | Gate Width W (μm) | Gate Length L (μm) |
| --- | --- | --- |
| Transistor 3 | 4.0 | 0.4 |
| Transistor 4 | 16.0 | 0.4 |
| Transistor 5 | 0.32 | 0.5 |
| Transistor 6 | 5.5 | 0.4 |
| Transistor 7 | 5.5 | 0.4 |
| Transistor 8 | 7.0 | 0.4 |
| Transistor 9a | 3.36 | 0.1 |
| Transistor 9b | 1.3 | 0.1 |
| Transistor 10a | 20.0 | 0.4 |
| Transistor 10b | 8.3 | 0.4 |
| Transistor 11a | 20.0 | 0.4 |
| Transistor 11b | 8.3 | 0.4 |
| Transistor 31 | 0.4 | 0.4 |

Referring to Table 2, a gate width W31 (for example, 0.4 μm) of P channel MOS transistor 31 is made sufficiently smaller than gate width W7 (for example, 5.5 μm) of N channel MOS transistor 7, preferably by about 0.03-0.2 times. With this, a current driving capability of P channel MOS transistor 31 becomes sufficiently lower than that of N channel MOS transistor 7. Therefore, the potential of node N1 rapidly decreases when the input signal rises from the "L" level to the "H" level and N channel MOS transistor 7 is brought into conduction.

Other relations of gate widths Ws and gate lengths Ls of the transistors are not described here in detail because the relations are similar to those described using Table 1.

Modified Example of Second Embodiment

Figure 11:
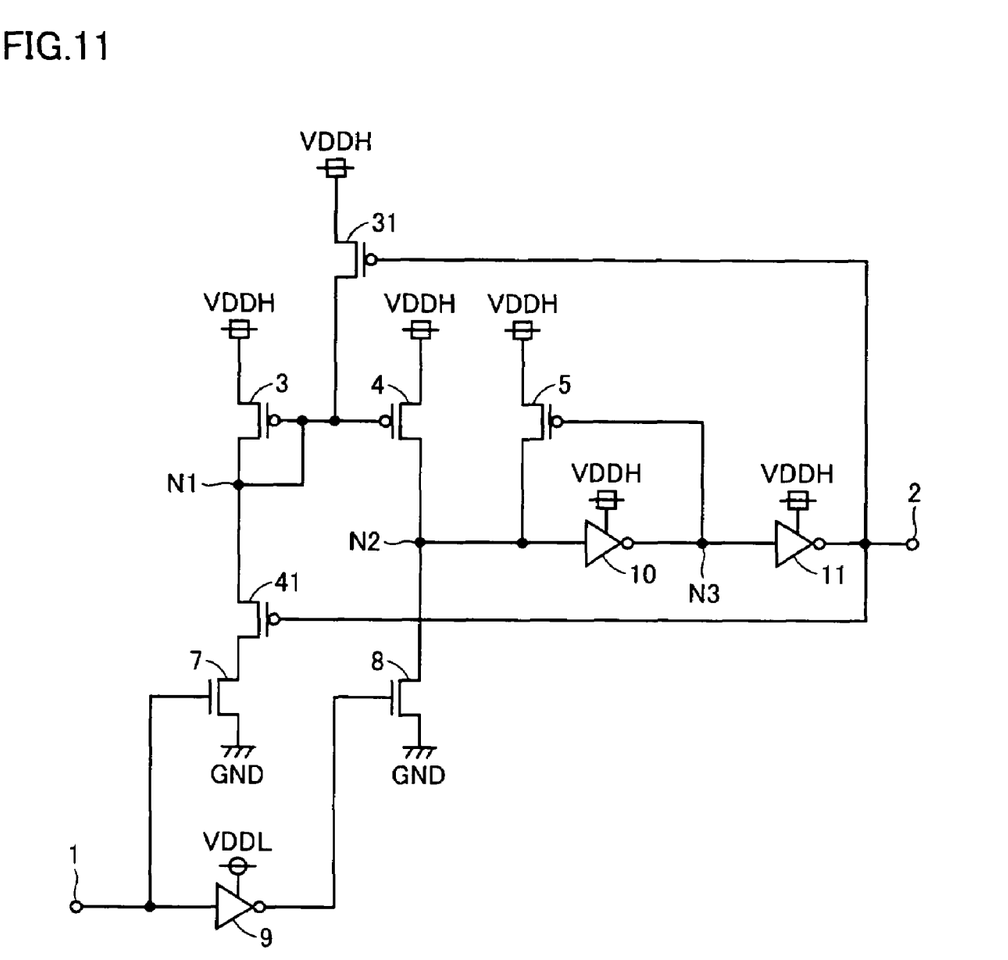
FIG. 11 is a circuit diagram of a construction of a level conversion circuit according to a modified example of the second embodiment of the present invention.

Referring to FIG. 11, a level conversion circuit of FIG. 11 is different from the level conversion circuit of FIG. 9 in that, N channel MOS transistor 6 is replaced with a P channel MOS transistor 41. It is to be noted that, portions of FIG. 11 corresponding to those of FIG. 9 are indicated with the same characters and detailed descriptions thereof will not be repeated.

P channel MOS transistor 41 has a source connected to node N1, a drain connected to the drain of N channel MOS transistor 7, and the gate connected to output terminal 2. P channel MOS transistor 41 is brought out of conduction when, in response to the input signal rising from the "L" level (0 V) to the "H" level (VDDL), the potential of output terminal 2 rises from the "L" level (0 V) to the "H" level (VDDH), and is brought into conduction when, in response to the input signal falling from the "H" level (VDDL) to the "L" level (0 V), the potential of output terminal 2 falls from the "H" level (VDDH) to the "L" level (0 V).

Therefore, the level conversion circuit shown in FIG. 11 performs a level conversion operation similar to that of the level conversion circuit shown in FIG. 9. Thus, in this modified example of the second embodiment, the leak current is prevented from flowing through P channel MOS transistor 4, similarly as in the second embodiment. With this, a further decreased power consumption of the level conversion circuit can be attained.

Though it is described that the gate of P channel MOS transistor 31 is connected to output terminal 2, the gate of P channel MOS transistor 31 may be connected to node N2.

It is to be noted that, though the level conversion circuit described in the embodiment converts the voltage level of the input signal from power supply potential VDDL to power supply potential VDDH (>VDDL), two power supply systems may be interchanged. That is, the level conversion circuit may convert the voltage level of the input signal from power supply potential VDDH to power supply potential VDDL (<VDDH). In addition, the power supply potentials of the two power supply systems may become identical. In any situation, since the construction of the current mirror circuit is utilized, a high-speed switching operation and a decreased power consumption can be attained as compared to the construction as shown in FIG. 3.

In addition, a plurality of types of level conversion circuits may be combined and arranged on the same semiconductor chip. When three power supply systems having power supply potentials different from each other are used, for example, the level conversion circuit shown in FIG. 1 or the level conversion circuit shown in FIG. 8 may be arranged corresponding to each of the power supply potentials.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level conversion circuit for converting a first signal having a first logic level of a reference potential and a second logic level of a first power supply potential into a second signal having a first logic level of said reference potential and a second logic level of a second power supply potential for providing said second signal to an output node, said level conversion circuit comprising:
   a first transistor of a first conductivity form having a first electrode receiving said second power supply potential, and a gate electrode and a second electrode connected to each other;
   a second transistor of the first conductivity form having a first electrode receiving said second power supply potential, a gate electrode connected to the gate electrode of said first transistor and a second electrode connected to a prescribed node;
   a third transistor of a second conductivity form having a gate electrode receiving said first signal;
   a first switching element of the second conductivity form connected between the second electrode of said first transistor and said reference potential in series with said third transistor;
   a fourth transistor of the second conductivity form having a first electrode connected to said prescribed node, a gate electrode receiving an inverted signal of said first signal and a second electrode receiving said reference potential;
   a second switching element of the first conductivity form connected between said second power supply potential and said prescribed node; and
   an output circuit having a first inverter for bringing said first switching element into conduction and said second switching element out of conduction to set said output node to said reference potential when a potential of said prescribed node is lower than a prescribed level, and for bringing said first switching element out of conduction and said second switching element into conduction to set said output node to said second power supply potential when the potential of said prescribed node is higher than said prescribed level, wherein:
   said first inverter comprises a fifth transistor of the first conductivity form and a sixth transistor of the second conductivity form;
   said third transistor, said first switching element and said fourth transistor are arranged in a first well region;
   said first transistor, said second transistor, said second switching element and said fifth transistor are arranged in a second well region;
   said sixth transistor is arranged in a third well region; and
   said second well region is arranged between said first well region and said third well region.

2. The level conversion circuit according to claim 1, wherein:
   said first inverter outputs said second power supply potential when the potential of said prescribed node is lower than said prescribed level and outputs said reference potential when the potential of said prescribed node is higher than said prescribed level;
   said output circuit further comprises a second inverter setting said output node to said reference potential when an output potential of said first inverter is said second power supply potential and setting said output node to said second power supply potential when the output potential of said first inverter is said reference potential;
   said first switching element is a seventh transistor of the second conductivity form having a gate electrode receiving the output potential of said first inverter; and
   said second switching element is an eighth transistor of the first conductivity form having a first electrode receiving said second power supply potential, a gate electrode receiving the output potential of said first inverter and a second electrode connected to said prescribed node.

3. The level conversion circuit according to claim 1, further comprising
   a third switching element connected between said second power supply potential and gate electrodes of said first and second transistors,
   wherein said output circuit is configured to bring said third switching element into conduction when the potential of said prescribed node is lower than said prescribed level, and bring said third switching element out of conduction when the potential of said prescribed node is higher than said prescribed level.

4. The level conversion circuit according to claim 3, wherein
   said third switching element is a ninth transistor of the first conductivity form having a first electrode receiving said second power supply potential, a gate electrode connected to one of said prescribed node and said output node, and a second electrode connected to gate electrodes of said first and second transistors.

5. The level conversion circuit according to claim 2, wherein
   said eighth transistor has a current driving capability lower than that of said fourth transistor.

6. The level conversion circuit according to claim 5, wherein
   said eighth transistor has a gate width smaller than that of said fourth transistor.

7. The level conversion circuit according to claim 5, wherein
   said eighth transistor has a gate length larger than that of said fourth transistor.

8. The level conversion circuit according to claim 4, wherein
   said ninth transistor has a current driving capability lower than that of said third transistor.

9. The level conversion circuit according to claim 8, wherein
   said ninth transistor has a gate width smaller than that of said third transistor.

10. The level conversion circuit according to claim 1, wherein
    said second power supply potential is higher than said first power supply potential.

11. A level conversion circuit for converting a first signal having a first logic level of a reference potential and a second logic level of a first power supply potential into a second signal having a first logic level of said reference potential and a second logic level of a second power supply potential for providing to an output node, said level conversion circuit comprising:
    a first transistor of a first conductivity form having a first electrode receiving said second power supply potential;
    a second transistor of the first conductivity form having a first electrode receiving said power supply potential, and a second electrode connected to a prescribed node;
    a third transistor of a second conductivity form having a gate electrode receiving said first signal;

a first switching element of the second conductivity form connected between said first transistor and said reference potential in series with said third transistor;

a fourth transistor of the second conductivity form having a first electrode connected to said prescribed node, a gate electrode receiving an inverted signal of said first signal and a second electrode receiving said reference potential;

a second switching element of the first conductivity form connected between said second power supply potential and said prescribed node; and an output circuit having a first inverter for brining said first switching element into conduction and said second switching element out of conduction to set said output node to said reference potential when a potential of said prescribed node is lower than a prescribed level, and for bringing said first switching element out of conduction and said second switching element into conduction to set said output node to said second power supply potential when the potential of said prescribed node is higher than said prescribed level, wherein:

said first inverter comprises a fifth transistor of the first conductivity form and a sixth transistor of the second conductivity form;

said third transistor, said first switching element and said fourth transistor are arranged in a first well region;

said first transistor, said second transistor, said second switching element and said fifth transistor are arranged in a second well region;

said sixth transistor is arranged in a third well region; and said second well region is arranged between said first well region and said third well region.

12. The level conversion circuit of claim 11, wherein:

said first transistor has a gate electrode and a second electrode connected to each other; and said first switching element is connected between the second electrode of said first transistor and said reference potential in series with said third transistor.

* * * * *